(12) United States Patent
Nation et al.

(10) Patent No.: US 7,496,861 B2
(45) Date of Patent: Feb. 24, 2009

(54) METHOD FOR GENERALIZING DESIGN ATTRIBUTES IN A DESIGN CAPTURE ENVIRONMENT

(75) Inventors: George W. Nation, Rochester, MN (US); Gary Lippert, Kasson, MN (US); Gary S. Delp, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 293 days.

(21) Appl. No.: 11/290,186

(22) Filed: Nov. 30, 2005

(65) Prior Publication Data

US 2007/0124716 A1    May 31, 2007

(51) Int. Cl.
G06F 17/50 (2006.01)
(52) U.S. Cl. ............................ 716/1; 716/18
(58) Field of Classification Search .......... 716/1, 716/3–5, 8–14, 18; 700/95–98, 103
See application file for complete search history.

(56) References Cited

U.S. PATENT DOCUMENTS 6,948,145 B2 * 9/2005 Brown et al. .................. 716/12
6,976,239 B1 * 12/2005 Allen et al. .................... 716/16

* cited by examiner

Primary Examiner—Vuthe Siek
(74) Attorney, Agent, or Firm—Christopher P. Maiorana, PC

(57) ABSTRACT

A method for generalizing design attributes in a design capture environment comprising the steps of (A) defining a procedure for adding one or more auxiliary configurators to a tool or suite of tools, (B) linking the auxiliary configurators to predetermined object points in an abstracted design and (C) defining a procedure for the tool or suite of tools to reference the one or more auxiliary configurators, wherein the auxiliary configurators are neither referenced by a core nor built into the tool or suite of tools.

20 Claims, 4 Drawing Sheets

METHOD FOR GENERALIZING DESIGN ATTRIBUTES IN A DESIGN CAPTURE ENVIRONMENT

FIELD OF THE INVENTION

The present invention relates to electronic design automation (EDA) generally and, more particularly, to a method for generalizing design attributes in a design capture environment.

BACKGROUND OF THE INVENTION

Conventional design assembly tools have a fixed set of attributes that can be collected for a core as the core is instantiated into a design. The attributes are known either (1) to the core designer when the design description is created or (2) to the tool designer. However, there can be attributes that are independent and/or unknown to (i) the core, (ii) the core designer (iii) the design assembly tool and (iv) the tool designer that would be advantageous to represent and specify during design assembly.

It would be desirable to have a solution for specifying a set of attributes (or parameters) to collect on cores, interfaces of the cores, groups of cores and/or interfaces of the groups of cores where the set of parameters is unknown and/or independent to the set of cores and interfaces.

SUMMARY OF THE INVENTION

The present invention concerns a method for generalizing design attributes in a design capture environment comprising the steps of (A) defining a procedure for adding one or more auxiliary configurators to a tool or suite of tools, (B) linking the auxiliary configurators to predetermined object points in an abstracted design and (C) defining a procedure for the tool or suite of tools to reference the one or more auxiliary configurators, wherein the auxiliary configurators are neither referenced by a core nor built into the tool or suite of tools.

The objects, features and advantages of the present invention include providing a method for generalizing design attributes in a design capture environment that may (i) provide definition, visualization, specification and storage or generalized attributes and group attributes to one or more design assembly tools, (ii) provides an approach that may be standardized, (iii) include foreign attributes into a design assembly tool along with rules for using the attributes and processing the design according to the attributes, (iv) allow unique and non-unique aspects of a design platform to be expressed, manipulated and collected by EDA tools and/or (v) define and add attributes and attribute sets to a design assembly tool in a dynamic, standard, cross-platform, and tool neutral manner.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides a method for adding the definition, visualization, specification, and/or storage of generalized attributes and group attributes for a class of electronic design automation (EDA) design assembly tools. The present invention may be applied generally to a variety of products. In one example, the present invention may provide an approach that may be standardized. As used herein the term standardized encompasses both (i) similar configuration of the manner in which tools use auxiliary configurations and/or auxiliary attributes and (ii) agreement amongst companies to use a specific method and/or apparatus (e.g., creation of a standard). The present invention generally facilitates inclusion of foreign attributes into a design assembly tool along with rules for using the attributes and processing a design according to the attributes. Examples of design assembly tools include Mentor Graphics Platform Express®, Synopsys CoreAssembler®, Prosilog Magillem®, and Beach Solutions EASI-Studio®. In general, XML (eXtensible Markup Language) may be used to carry descriptions of cores and designs built from the cores. In one example, an XML schema similar to the SPIRIT schema, offered by the SPIRIT Consortium, may be implemented.

The present invention generally enables unique and non-unique aspects of a design platform device (e.g., a platform or structured application specific integrated circuit (ASIC)) to be expressed, manipulated and collected by the EDA tools. In general, the set of attributes and attribute sets are not known at the design time of the tool. The present invention may provide a process for defining and adding attributes and attribute sets to a design assembly tool in a dynamic, standard, cross-platform, and/or tool-neutral manner.

Figure 1:
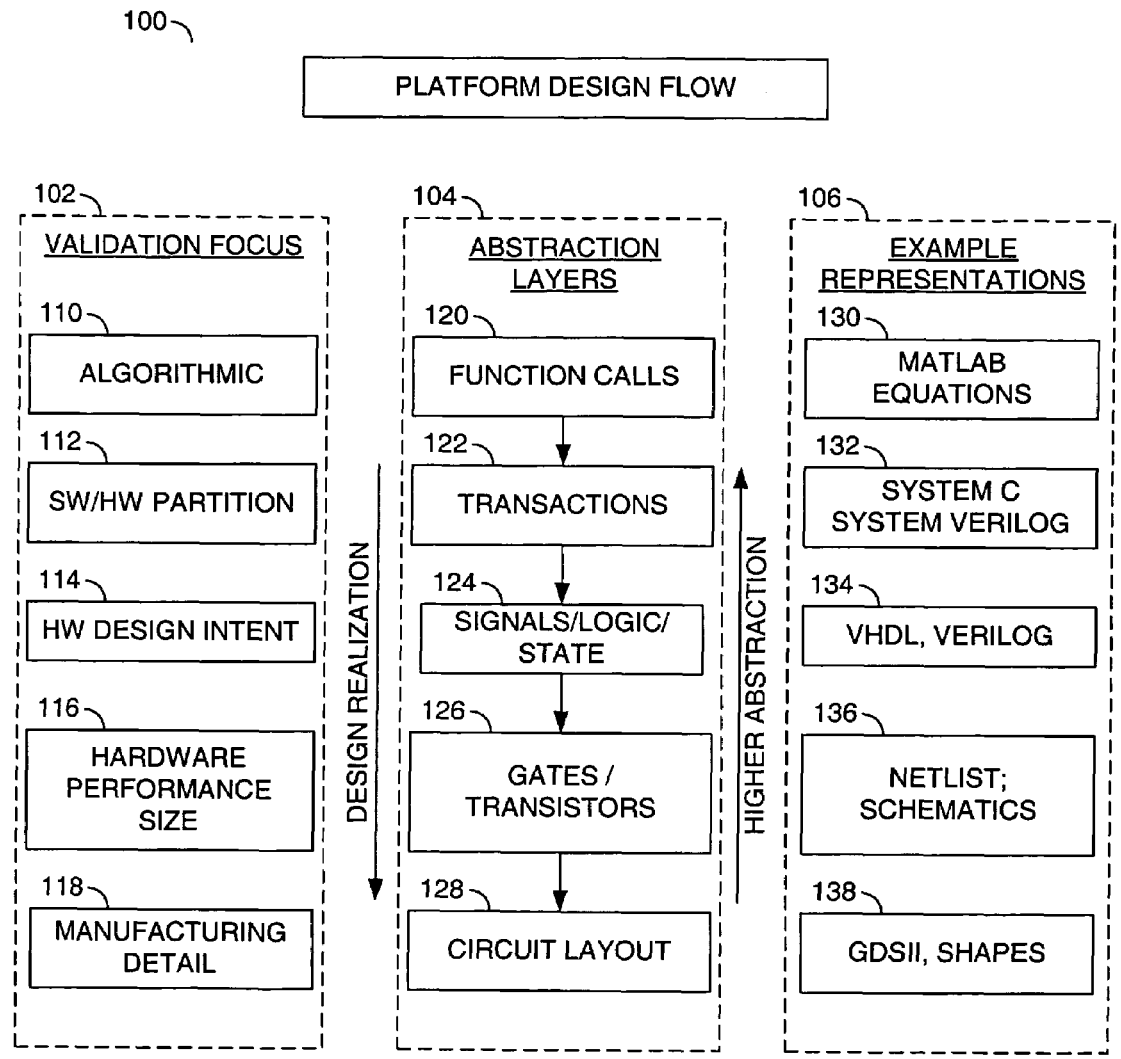
FIG. 1 is a flow diagram illustrating an example platform design flow.

Referring to FIG. 1, a flow diagram 100 is shown illustrating an example platform design flow in accordance with a preferred embodiment of the present invention. The design flow 100 may comprise three partitions: a validation focus 102, abstraction layers 104 and example representations 106. The validation focus 102 may be comprise (i) an algorithmic stage 110, (ii) a software and hardware (SW/HW) partition 112, (iii) a hardware design intent stage 114, (iv) a hardware performance size stage 116 and (v) a manufacturing detail stage 118.

The abstraction layers 104 of the platform design flow 100 may comprise a number of levels corresponding to the stages of the validation focus 102. In one example, the abstraction layers may comprise (i) function calls 120, (ii) transactions 122, (iii) signals, logic and states 124, (iv) gates and transistors 126 and (v) circuit layout 128. The platform design flow 100 generally moves through the abstraction layers starting with function calls 120 and moving towards the circuit layout 128 as a design is realized. In general, the earlier in the design flow a design realization step occurs, the higher the abstraction of the design realization step.

A number of representations 106 may be used for the abstraction layers 104. In one example, the function calls abstraction layer 120 may be represented by MATLAB® equations 130 (MATLAB is a registered trademark of The MathWorks, Inc., Natick, Mass.). The transactions abstraction layer 122 may be represented in system C or system verilog (e.g., block 132). The signals, logic and states abstraction layer 124 may be represented in VHDL and/or verilog (e.g., block 134). The gates and transistor abstraction layer 126 may be represented using netlists and/or schematics (e.g., block 136). The circuit layout abstraction layer 128 may be represented using GDSII and/or shapes (e.g., block 138).

However, other representations may be implemented accordingly to meet design criteria of a particular implementation.

Figure 2:
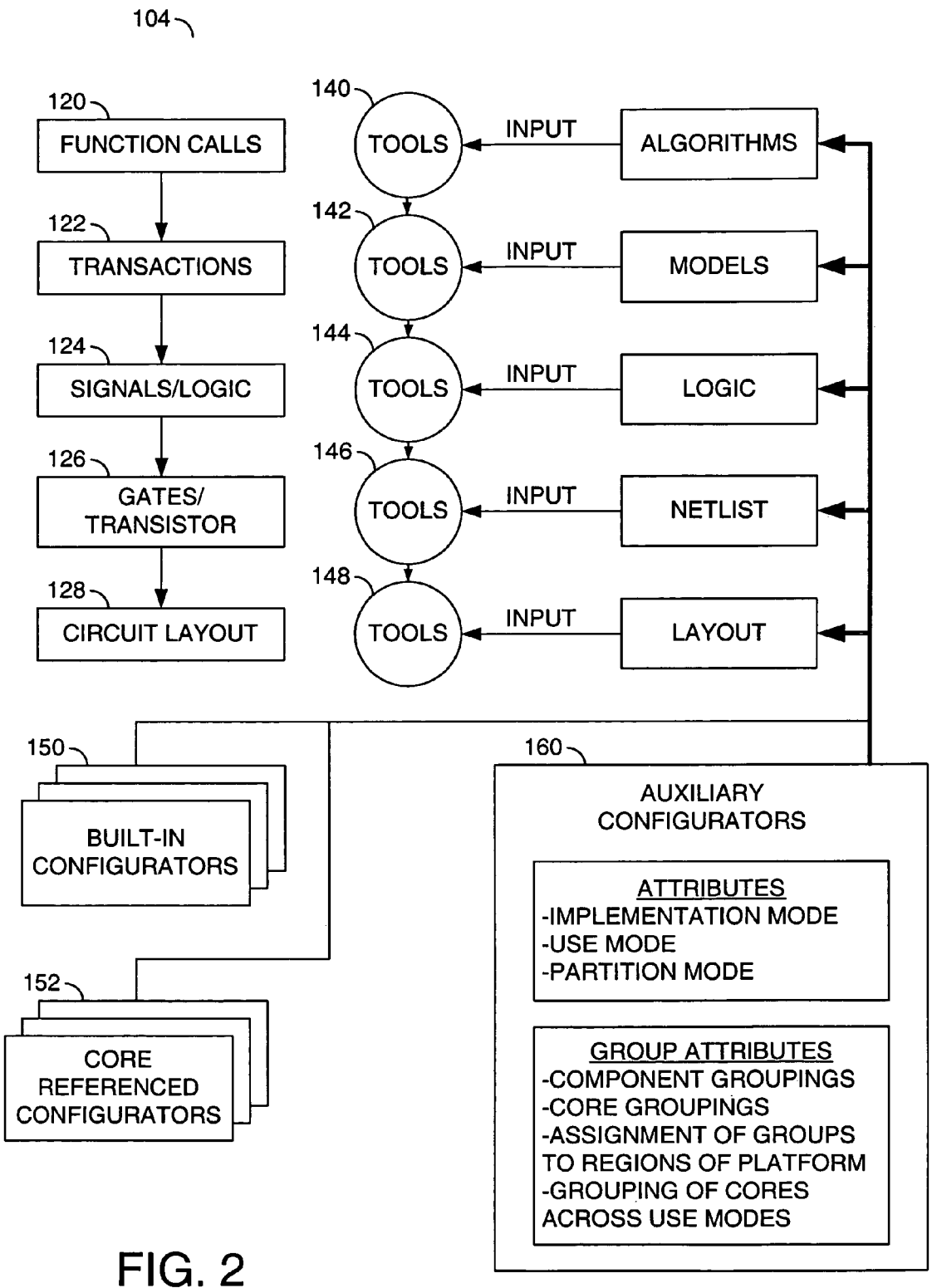
FIG. 2 is a more detailed diagram of a design flow.

Referring to FIG. 2, a more detailed flow diagram of the abstraction layers 104 is shown illustrating an IP model co-relationship in accordance with a preferred embodiment of the present invention. In one example, each of the abstraction layers may be implemented with one or more tools. For example, the function calls abstraction layer 120 may be implemented with tools 140. The transactions abstraction layer 122 may be implemented with tools 142. The signals, logic and states abstraction layer 124 may be implemented with tools 144. The gates and transistor abstraction layer 126 may be implemented with tools 146. The circuit layout abstraction layer 128 may be implemented with tools 148. The tools 140-148 may be implemented with conventional techniques.

In one example, the tools 140-148 may be configured to use configurators 150 that are built into the tools and configurators 152 that are referenced by and/or supplied with cores being added to a particular design. In a preferred embodiment of the present invention, the tools 140-148 may be further configured to use auxiliary (or ancillary) configurators, attributes and/or group attributes 160. The configurators 150 and 152 are generally defined either as a fixed base capability of one of the tools 140-148 or as an add-on capability supplied with particular cores. In contrast to the configurators 150 and 152, the auxiliary configurators 160 are generally not referenced by either cores or built-in to the tools.

In one example, the auxiliary configurators, attributes and/or group attributes 160 may be implemented in extensible mark-up language (XML). The auxiliary configurators, attributes and/or group attributes 160 may comprise attribute and/or groups of attributes that may be collected by one or more of the tools 140-148 implementing the abstraction layers 104 of the design flow 100.

Examples of attributes that may be specified and collected at the design capture stage may include, but are not limited to, (i) implementation mode, (ii) use mode and (iii) partition mode. The implementation mode attribute may comprise, in one example, modes including full-mask programmable, metal-mask programmable, electrically programmable, and software programmable. The use mode attribute may comprise, in one example, modes including functional core, verification core, and proxy implementation core. The partition mode attribute may comprise, in one example, modes including base platform, off-die, and off-die system in package. However, other modes may be implemented to meet the design criteria of a particular implementation.

Examples of group attributes that may be specified and captured during the design capture stage may include (a) grouping of components such as (i) memories, (ii) serializer/deserializers (SERDES), and/or (iii) processors (CPUs) that may be assigned to a specific off-die system in package component, (b) grouping of cores with an electrically-programmable implementation mode, (c) assignment of the groups to specific electrically programmable regions of the base platform, and (d) grouping of cores across use modes to specify or confirm core alternatives for synthesis, verification, packaging, etc.

In general, the tools 140-148 represent available EDA industry tools configured to work at the respective abstraction layers. For example, in a fairly complex design (e.g., where one part of the design performs control flow or processor oriented control flow for operating on data and another part of the design performs data streaming or data driven operations on data) multiple different tools may be used to facilitate the design at a particular abstraction level (e.g., Function calls).

For example, different tools may be utilized to design the control flow and the data flow portions of the design separately. However, at a subsequent layer of abstraction to realizing the design (e.g., the transactional layer), one tool may be sufficient to perform the tasks at that transaction level.

In general, the present invention may be implemented with multiple tools at a given layer of abstraction, with each of those tools having a respective output. The multiple outputs may be imported into one or possibly more tools down at the next layer of abstraction. For example, instead of one stream of data going down through the abstractions layers, multiple streams of data may be merging all the way down to one final design in the end. For example, a chip is generally manufactured at one location and a single tool may be used to draw all the shapes for producing the reticle masks. In general, the present invention may facilitate a physical design tool flow that may import multiple design descriptions. In one example, the auxiliary configurators, attributes and/or groups of attribute 160 may be made available to every layer of abstraction in the design flow 100.

As used herein, logic generally refers to hardware, code generally refers to software (e.g., C code, etc.), and netlist generally refers to the hardware analog to assembler code. In one example, deliverables as used herein may refer to one or more of code, logic, assembler code, and netlists. In another example, deliverables may also refer to layout information and even microcode for one or more cores. In one example, code may comprise a driver routine for a particular piece of hardware, a device driver for a particular piece of hardware, a diagnostic code to run to make sure the corresponding logic is connected properly, etc.

In general, the design assembly tool flow 100 allows a user to navigate a design and establish settings for the attributes, as well as group cores and/or interfaces into the attribute sets. In general, the tool may be unaware of the purpose for which the attributes and attribute sets are defined. The settings for the attributes and attribute sets are generally stored along with the specification for the design. Generators or other tools provided in the flow 100 may be configured to use the settings (e.g., for automating certain views of the design, etc.). An advantage of adding the capability of the present invention to the design assembly tool (which does not understand the attributes being collected) is that the design assembly tool is preferably the only step in the flow where the entire design is visualized and managed at an abstracted block diagram level. Adding the capability provided by the present invention to the design assembly tool is more advantageous than defining and developing yet another tool that visualizes the design at the same level of abstraction for the sole purpose of collecting the ancillary attributes. Adding the capability provided by the present invention to the design assembly tool is more advantageous because (1) design visualization tools are especially difficult to develop and (2) the user experience of buying and learning another tool for each set of ancillary attributes can be onerous and may prevent some users from selecting a product.

Figure 3:
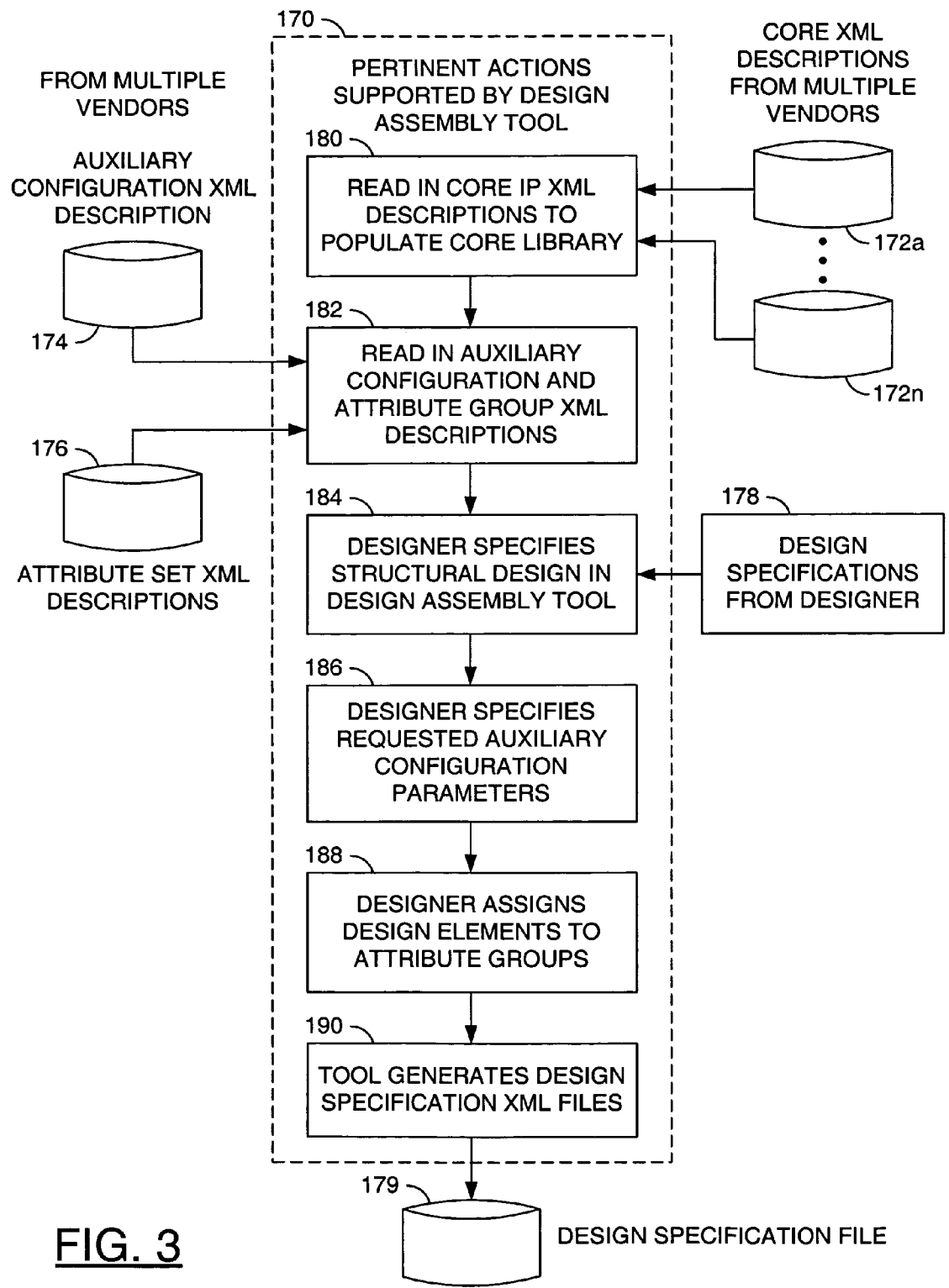
FIG. 3 is a detailed diagram of a design assembly tool flow.

Referring to FIG. 3, a detailed diagram is shown illustrating a portion of a design assembly tool flow 170 in accordance with the present invention. In one example, the design assembly tool flow 170 may have a first input that may receive core XML descriptions from multiple vendors 172a-172n, a second input that may receive one or more auxiliary configuration XML descriptions 174, a third input that may receive one or more attribute set XML descriptions 176, a fourth input that may receive specifications 178 and an output that may present a design specification file 179. In one example, the core XML descriptions, the auxiliary configuration XML descriptions and the attribute set XML descriptions may be from multiple vendors.

In one example, the design flow 170 may comprise a process (or state) 180, a process (or state) 182, a process (or state) 184, a process (or state) 186, a process (or state) 188 and a process (or state) 190. The process 180 may be configured to read in core intellectual property (IP) XML descriptions to populate a core library. The process 182 may be configured to read in auxiliary configuration and attribute group XML descriptions. The process 184 may be configured to receive designer specifications for specifying a structural design in the design assembly tool. The process 186 may be configured to receive designer specifications for requested auxiliary configuration parameters. The process 188 may be configured to receive designer assignments between design elements and attribute groups. The process 190 may be configured to generate design specification XML files.

During a design assembly process, the design assembly tool 170 may enter the process 180. The process 180 may be configured to read in the core XML descriptions 172a-172n that may be provided by various vendors. When the core XML descriptions have been read in, the tool flow 170 may move to the process 182. In the process 182, the tool flow 170 may read in the one or more auxiliary configuration XML descriptions 174 and the one or more attribute group XML descriptions 176. When the auxiliary configuration and attribute group descriptions have been read in the design assembly tool 170 may move to the process 184. In the process 184, design specifications 178 are received from the designer. The design specifications may specify a structural design in the design assembly tool 170. When the structural design in the design assembly tool has been specified, the design assembly tool 170 may move to the process 186.

In the process 186, the designer may be prompted (or requested) to specify auxiliary configuration parameters. The auxiliary configuration parameters sought may be specified by the one or more auxiliary configuration XML description 174. When the auxiliary configuration parameters have been received (or entered), the design assembly tool 170 may move to the process 188. In the process 188, the design assembly tool 170 may prompt (or request) the designer to assign design elements to attribute groups specified by the attribute group XML descriptions 176. When the design elements have been assigned to attribute groups, the design assembly tool 170 may move to the process 190. In the process 190, the design assembly tool 170 may be configured to generate the design specification XML file 179 based on the core XML descriptions, the one or more auxiliary configuration XML descriptions, the one or more attribute set XML descriptions, the design specifications from the designers, the auxiliary configuration parameters from the designer and the assignment of design elements to attribute groups.

In one example, an auxiliary configuration XML description file for an auxiliary configurator in accordance with a preferred embodiment of the present invention may be implemented as illustrated by the following sample definition:

```
<auxConfigurator>
    <vendor>VENDOR_X</vendor>
    <library>LIBRARY_X</library>
    <name>CONFIGURATOR_X</name>
    <version>1.0</version>
    <AppliesTo>busDefinition busInterface channel component
    design</AppliesTo>
```

-continued

```
    <configurators>configurator.java</configurators>
    <choices>
        <choice>
            <name>choiceTypes</name>
            <enumeration>NULL FPGA ASPP ASIC EMUL
            STRUCT</enumeration>
        </choice>
    </choices>
    <parameter name="logicType" id="logicChoice"
    dependency="user" choiceStyle="combo"
    choiceRef="choiceTypes" prompt="How will this logic be
    implemented?">NULL</parameter>
</auxConfigurator>
```

The structure of the auxiliary configurator definition may be presented in a manner that may be mapped easily to a SPIRIT Consortium schema for describing and establishing parameters for a design component. In one example, the auxiliary configurator and the SPIRIT component schema may share many parameters for descriptions. Because an auxiliary configurator shares many of the same parameters for description as in the component schema, the basic schema for the SPIRIT component schema is used for illustration and familiarity to those skilled in the relevant art(s). In one example, the auxiliary configurator may be named, identified, and versioned in the "NLNV" set of tags (e.g., <vendor>, <library>, <name>, and <version>). Parameters may be established and parameter values may be constrained using the <parameter> and <choices><choice> tags. Any configurator code implemented to establish intermediate files and/or to provide complex logic steps in the setting of the parameters may be provided by the <configurators> tag.

The <auxConfigurator> schema and corresponding XML generally differ from the <component> schema because of the existence and interpretation of the <appliesTo> tag in the auxiliary configurator description. The <appliesTo> tag may be used to explicitly identify the design elements to which the auxiliary configurator may be applied. In one example, the values listed may correspond to identified SPIRIT design elements. For example, identified design elements may include "component", "design", "busInterface", "busDefinition", "channel", "memoryMap", "constraints", and "verificationIP". However, other elements (e.g., future design elements that may be added to SPIRIT) may be added by extension.

In the example above, a sample auxiliary configurator is illustrated that establishes a design parameter that applies to bus interfaces, busses and channels, components, or the entire design. For each instantiation of the design element types in the design, the auxiliary configurator establishes a persistent parameter that holds a value constrained to be one of NULL, FPGA, ASPP, ASIC, EMUL, or STRUCT. Given the auxiliary configurator definition, a design assembly tool may present a question such as "How will this logic be implemented?" for each of the design element types listed in the <appliesTo> tag. The answer(s) collected by the design assembly tool may be constrained, in one example, to a value such as NULL, FPGA, ASPP, ASIC, EMUL, or STRUCT. The answer(s) may be associated with the selected design element in the design and stored in the design XML file for the design. An example of information that may be stored is illustrated below in connection with an example of a design XML file.

In one example, an XML file for an attribute set description in accordance with a preferred embodiment of the present invention may be implemented as illustrated in the following sample attribute set definition:

```
<attributeSet>
    <vendor>VENDOR_X</vendor>
    <library>LIBRARY_X</library>
    <name>ATTRIBUTE_SET_X</name>
    <version>1.0</version>
    <AppliesTo>busDefinition busInterface channel component
    design</AppliesTo>
    <parameter name="logicTypeGroup" dependency="user"
    prompt="Logic type grouping"></parameter>
</attributeSet>
```

The structure of the attribute set definition may be configured in a manner that may be mapped easily to the SPIRIT Consortium schema for describing and establishing parameters for a design component. The basic schema for the SPIRIT component schema may be used for illustration and familiarity to those skilled in the relevant art(s).

The attribute set description may be named, identified, and versioned using the "NLNV" set of tags (e.g., <vendor>, <library>, <name>, and <version>). Parameters may be established using the <parameter> tag. What sets the <attributeSet> schema and corresponding XML apart from, for example, the <component> schema is the existence and interpretation of the attribute set <appliesTo> tag. Following the <appliesTo> tag the design elements to which the attribute set may be applied are explicitly listed. In one example, the values listed may correspond to identified SPIRIT design elements including "component", "design", "busInterface", "busDefinition", "channel", "memoryMap", "constraints", and "verificationIP". However, other elements (e.g., future design elements that may be added to SPIRIT) may be added by extension.

In the sample attribute set above, and example is given of an attribute set definition that establishes a design parameter that may apply to bus interfaces, busses and channels, components, or the entire design. In general, the above XML description defines a specific type of attribute set that may be instantiated (defined and named by the user) and have design elements added into the defined attribute set.

In the ongoing example of specifying logic implementation types for different logic design elements in the design, the sample attribute set XML description above would generally accompany a corresponding sample auxiliary configuration XML description file for a sample auxiliary configurator. The two descriptions in combination may configure a design tool to collect auxiliary information on design elements, and also establish attribute sets where the design elements may be grouped together for a useful design partition. For example, a design may use the tool to identify which design elements are to be implemented in FPGA logic. The designer, via an attribute set description, may group those FPGA-targeted design elements into one or more "logic type grouping" attribute sets such that the design is partitioned across several FPGA partitions or chips. A similar outcome with the above examples may be obtained for logic targeted for an emulator or cell-based ASIC logic.

In one example, the example auxiliary configuration XML description and the example attribute set XML description from above may be used by a tool to produce a design XML file as illustrated in the following sample XML design file:

```
<design>
    <vendor>VENDOR_NAME</vendor>
    <library>LIBRARY_NAME</library>
    <name>SAMPLE_DESIGN</name>
    <version>1.0</version>
    <componentInstances>
        <componentInstance>
            <instanceName>Core_1_A</instanceName>
            <componentRef vendor="CORE_VENDOR"
            library="CORE_LIBRARY" name="Core_1"/>
            <auxConfiguratorRef vendor="VENDOR_X"
            library="LIBRARY_X" name="CONFIGURATOR_X">
                <configuration>
                    <configurableElement
                    referenceId="logicType">
                        <configurableElementValue>FPGA
                        </configurableElementValue>
                    </configurableElement>
                </configuration>
            </auxConfiguratorRef>
        </componentInstance>
        <componentInstance>
            <instanceName>Core_2_A</instanceName>
            <componentRef vendor="CORE_VENDOR"
            library="CORE_LIBRARY" name="Core_2"/>
            <auxConfiguratorRef vendor="VENDOR_X"
            library="LIBRARY_X" name="CONFIGURATOR_X">
                <configuration>
                    <configurableElement
                    referenceId="logicType">
                        <configurableElementValue>FPGA
                        </configurableElementValue>
                    </configurableElement>
                </configuration>
            </auxConfiguratorRef>
        </componentInstance>
    </componentInstances>
    <attributeSets>
        <attributeSet>
            <AttributeSetName>Logic Group 1</AttributeSetName>
            <auxConfiguratorRef vendor="VENDOR_X"
            library="LIBRARY_X" name="ATTRIBUTE_SET_X">
                <configuration>
                    <configurableElement
                    referenceId="logicTypeGroup">
                        <configurableElementValue>Core_1_A
                        Core_2_A</configurableElementValue>
                    </configurableElement>
                </configuration>
            </auxConfiguratorRef>
        </attributeSet>
    </attributeSets>
</design>
```

The XML design file may be presented as the output of the design assembly tool 170. In the above example, the design is illustrated containing two cores. Each core is specified, via auxiliary configurators, to be implemented in FPGA (field programmable gate array) logic. The two cores are grouped in the same logic type Attribute Group so that further design processing may place the two cores within the same FPGA logic function. Again, the structure is shown in a manner that may be mapped easily to the SPIRIT Consortium schema for describing a design. In general, the SPIRIT design schema is used for illustration and familiarity to those practicing in the relevant art(s).

In one example, the design may be named, identified, and versioned using the "NLNV" set of tags <vendor>, <library>, <name>, and <version>. In the above example, the design is illustrated containing two cores from a vendor named "CORE_VENDOR". The cores are named Core_1 and Core_2. The two cores may be instantiated in the design with the names Core_1_A and Core_2_A, respectively. Each instantiated core has an auxiliary configurator from vendor "VEN- DOR_X" and the name of the auxiliary configurator is "CONFIGURATOR_X" corresponding to the other examples above.

The user specified information collected by the design assembly tool 170 includes that Core_1_A and Core_2_A are to be implemented in FPGA logic (e.g., as illustrated by setting and storing in the XML file the "logicType" parameter value of "FPGA"). The example design XML file also illustrates where the user, via the design assembly tool 170, has specified that an instance of the Attribute Group named "ATTRIBUTE_SET_X" should be created and named "Logic Group 1". The example further illustrates where the designer has specified that both Core_1_A and Core_2_A should be placed in the Attribute Group "Logic Group 1".

Figure 4:
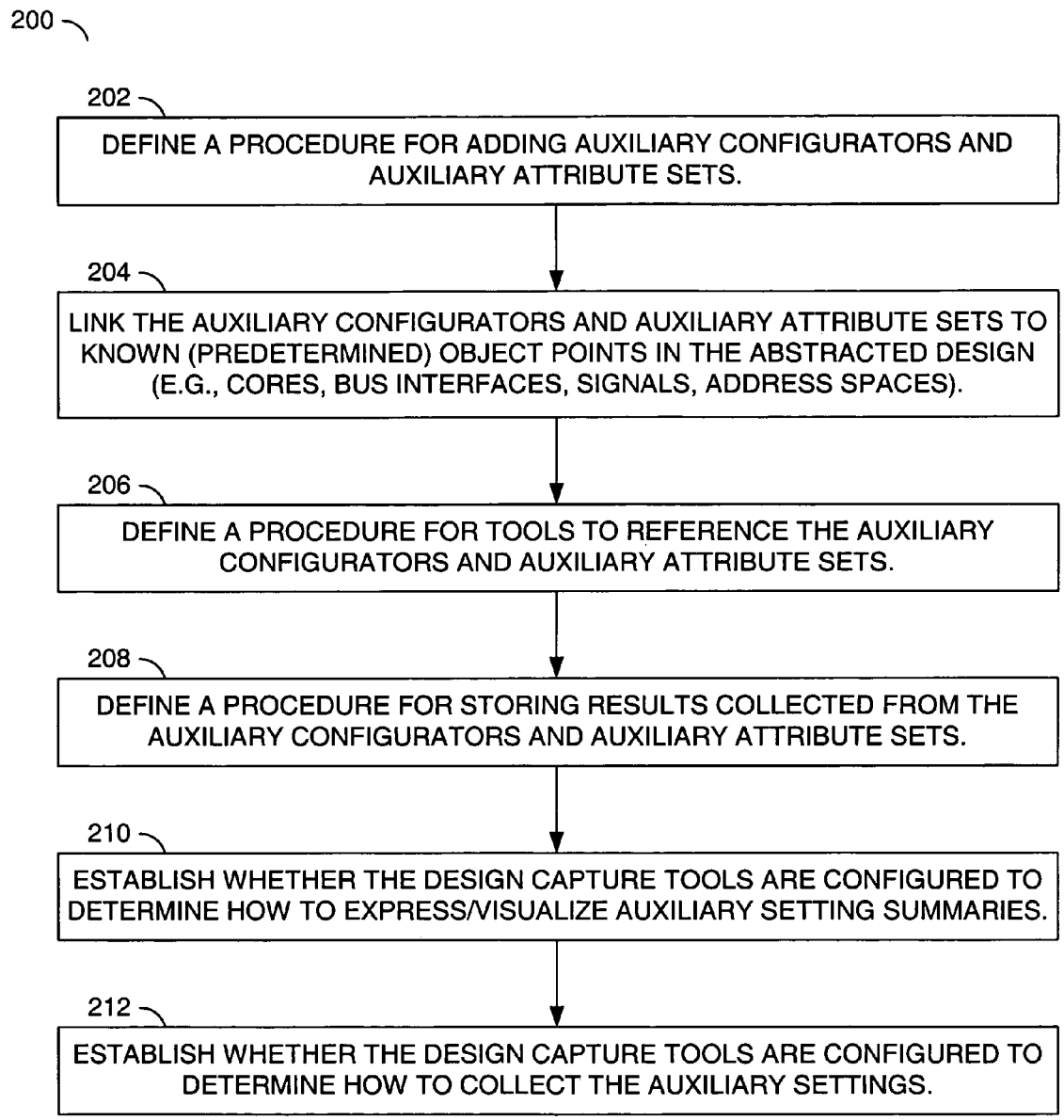
FIG. 4 is a flow diagram illustrating a process in accordance with a preferred embodiment of the present invention.

Referring to FIG. 4, a flow diagram is shown illustrating a process 200 in accordance with a preferred embodiment of the present invention. In one example, the process 200 may comprise a state (or block) 202, a state (or block) 204, a state (or block) 206, a state (or block) 208 and a state (or block) 210. The states 202, 206 and 208 may be implemented as process defining states. The states 210 and 212 may be implemented as configuration states.

In the state 202, the process 200 may define a procedure for adding auxiliary configurators and auxiliary attribute sets. The process 200 may move from the state 202 to the state 204. In the state 204, the auxiliary configurators and auxiliary attribute sets may be linked to known (or predetermined) object points in the abstracted design (e.g., cores, bus interfaces, signals, address spaces). The information for representing an auxiliary configurator or auxiliary attribute set generally comprises the following items:

a. Name, Vendor, Library, Version information.
    b. Denotation of auxiliary configurator or attribute set.
    c. Design element(s) the configurator applies (e.g., bus interface, address space, component, signal, module, I/O buffer).
    d. Any enumerated values that should be collected and set for the design elements.
    e. Help text for the configurator.

After the procedure for adding auxiliary configurators and auxiliary attribute sets is defined and the auxiliary configurators and auxiliary attribute sets are linked to the known object points in the abstracted design, the process 200 may move to the state 206. In the state 206, the process 200 may define a procedure for tools to reference the auxiliary configurators and auxiliary attribute sets. In one example, the procedure for tools to reference the auxiliary configurators and auxiliary attribute sets may be a standardization of the manner in which the auxiliary configurators and auxiliary attribute sets are used by the design capture tools. In one example (e.g., for SPIRIT), the manner in which the auxiliary configurators and auxiliary attribute sets are used by the design capture tools may be implicit in the top-level attribute in the schema (e.g., SPIRIT has no package structure, yet).

After the procedure for the tools to reference the auxiliary configurators and auxiliary attribute sets is defined, the process 200 may move to the state 208. In the state 208, the process 200 may define a procedure for storing results collected from the auxiliary configurators and auxiliary attribute sets. The procedure for storing results collected from the auxiliary configurators and auxiliary attribute sets may leverage and/or extend existing mechanisms for storing collected parameters. The information used for storing collected information for the auxiliary configurators or auxiliary attribute sets may include, but is not limited to, the following:

a. Unique instance name of the auxiliary configurator or auxiliary attributed set.
    b. Name of the referenced auxiliary configurator or auxiliary attributed set.
    c. For auxiliary configurators, a collected value for the design element.
    d. For auxiliary attribute sets, a listing of design elements included in the set.

In one example, (e.g., for SPIRIT), the design information may be stored within an extension to the currently defined design database schema.

After the procedure for storing results collected from the auxiliary configurators and auxiliary attribute sets is defined, the process 200 may move to the state 210. In the state 210, the process 200 may be configured to establish whether the design capture tools are configured to determine how to express/visualize auxiliary setting summaries.

After establishing that the design capture tools are configured to determine how to express/visualize auxiliary setting summaries, the process 200 may move to the state 212. In the state 212, the process 200 may be configured to establish whether the design capture tools are configured to determine how to collect the auxiliary settings.

In a preferred embodiment, the present invention may provide a set of SPIRIT namespace schema for (i) the auxiliary configurators, (ii) design database extensions, and (iii) example XML. The present invention may further provide flow diagrams illustrating how the auxiliary configurators are used in the design flow by (i) the design capture tools collecting the auxiliary parameters and (ii) the downstream generators acting upon the parameters. The present invention may further provide example screenshot depictions of (i) settings collection dialogs and (ii) settings visualization summaries.

The function(s) performed by the flow diagrams of FIGS. 3 and 4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMS, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for generalizing design attributes in a design capture environment comprising the steps of:
    (A) providing a data structure stored in a computer readable medium, said data structure containing information defining one or more auxiliary configurators, said one or more auxiliary configurators adding one or more auxiliary parameters to a design assembly tool or suite of design assembly tools, said one or more auxiliary configurators being in addition to one or more core-referenced configurators and one or more built-in configurators of said design assembly tool or suite of design assembly tools, wherein said one or more auxiliary configurators are (a) neither referenced by a core nor built into said design assembly tool or suite of design assembly tools and (b) independent of or unknown to (i) the core, (ii) a designer of the core (iii) the design assembly tool or suite of design assembly tools and (iv) a designer of the design assembly tool or suite of design assembly tools; and (B) linking said one or more auxiliary configurators to predetermined object points in an abstracted design based upon a field within each auxiliary configurator configured to identify one or more design elements to which each auxiliary configurator applies, wherein said design assembly tool or suite of design assembly tools is configured to read said one or more auxiliary configurators from said computer readable medium.

2. The method according to claim 1, further comprising the steps of:
providing a second data structure stored in said computer readable medium, said second data structure containing information defining one or more auxiliary attribute sets to be added to said design assembly tool or suite of design assembly tools; and
linking said auxiliary attribute sets to predetermined object points in said abstracted design, wherein said design assembly tool or suite of design assembly tools is configured to read said one or more auxiliary attribute sets from said computer readable medium.

3. The method according to claim 2, wherein each of said one or more auxiliary configurators and said one or more auxiliary attribute sets is represented by information selected from the group consisting of name, vendor, library, version information, denotation of auxiliary configurator or auxiliary attribute set, design element or elements the auxiliary configurator applies, and any enumerated values collected and set for the design elements.

4. The method according to claim 3, wherein each of said design element or elements is selected from the group consisting of bus interface, address space, component, signal, module, and I/O buffer.

5. The method according to claim 3, wherein each of said one or more auxiliary configurators comprise help text.

6. The method according to claim 2, wherein (i) a procedure for said tool or suite of tools to reference said one or more auxiliary configurators and (ii) a procedure for said design assembly tool or suite of design assembly tools to reference said one or more auxiliary attribute sets are standardized for one or more design capture tools.

7. The method according to claim 2, further comprising the step of:
storing results collected by said design assembly tool or suite of design assembly tools in response to said one or more auxiliary configurators and said one or more auxiliary attribute sets.

8. The method according to claim 7, wherein collected information for each of said one or more auxiliary configurators and said one or more auxiliary attribute sets is stored based on information comprising (i) a unique instance name of the auxiliary configurator or auxiliary attributed set, (ii) a name of the referenced auxiliary configurator or auxiliary attributed set, (iii) a collected value for each design element for auxiliary configurators and (iv) a listing of design elements included in each auxiliary attribute set.

9. The method according to claim 7, wherein the design information is stored within an extension to a currently defined design database schema.

10. The method according to claim 2, further comprising:
configuring said design assembly tool or suite of design assembly tools to collect auxiliary information on one or more design elements and establish one or more attribute sets in response to the one or more auxiliary configurators and the one or more auxiliary attribute sets, wherein the one or more design elements are grouped in a design partition.

11. The method according to claim 1, wherein said predetermined object points in said abstracted design are selected from the group consisting of cores, bus interfaces, signals, and address spaces.

12. The method according to claim 1, further comprising the step of:
establishing whether said design assembly tool or suite of design assembly tools are configured to determine how to express/visualize auxiliary setting summaries.

13. The method according to claim 12, further comprising the step of:
establishing whether said design assembly tool or suite of design assembly tools are configured to determine how to collect the auxiliary settings.

14. The method according to claim 1, further comprising the step of:
providing a set of namespace schema for (i) the one or more auxiliary configurators, (ii) design database extensions, and (iii) example XML.

15. The method according to claim 1, further comprising the step of:
providing one or more flow diagrams illustrating how the auxiliary configurators are used in the design flow by (i) said design assembly tool or suite of design assembly tools collecting the auxiliary parameters and (ii) downstream generators acting upon the parameters.

16. The method according to claim 1, further comprising the step of:
defining (i) one or more settings collection dialogs and (ii) one or more settings visualization summaries.

17. The method according to claim 1, wherein said data structure is defined using extensible markup language (XML).

18. A design capture environment comprising:
means for defining one or more auxiliary configurators and one or more auxiliary attribute sets, wherein said one or more auxiliary configurators and said one or more auxiliary attribute sets are read into a design assembly tool or suite of design assembly tools from a computer readable medium in addition to one or more built-in configurators and one or more core-referenced configurators, wherein said one or more auxiliary configurators are (a) neither referenced by a core nor built into said design assembly tool or suite of design assembly tools and (b) independent of or unknown to (i) the core, (ii) a designer of the core (iii) the design assembly tool or suite of design assembly tools and (iv) a designer of the design assembly tool or suite of design assembly tools;
means for linking said auxiliary configurators and said auxiliary attribute sets to predetermined object points in an abstracted design generated using said tool or suite of tools; and
means for said design assembly tool or suite of design assembly tools to reference said one or more auxiliary configurators and said one or more auxiliary attribute sets.

19. A design assembly tool comprising:
one or more built-in configurators;
one or more core-referenced configurators;
a first portion configured to read one or more auxiliary configurators and one or more auxiliary attribute sets to a design capture environment from a computer readable medium, said one or more auxiliary configurators adding one or more auxiliary parameters to said design assembly tool, wherein said one or more auxiliary configurators are (a) neither referenced by a core nor built into said design assembly tool and (b) independent of or unknown to (i) the core, (ii) a designer of the core (iii) the design assembly tool and (iv) a designer of the design assembly tool;
a second portion configured to link said one or more auxiliary configurators and said one or more auxiliary attribute sets to predetermined object points in an abstracted design based upon a field within each auxiliary configurator configured to identify one or more design elements to which each auxiliary configurator applies; and
a third portion configured to reference said one or more auxiliary configurators and said one or more auxiliary attribute sets.

20. The design assembly tool according to claim 19, further comprising:
a fourth portion configured to read in one or more core descriptions; and
a fifth portion configured to generate a design specification file based upon said one or more built-in configurators, said one or more core-referenced configurators, said one or more auxiliary configurators, said one or more auxiliary attribute sets, said one or more core descriptions and one or more designer specifications.

* * * * *